(12) United States Patent
Huang et al.

(10) Patent No.: US 7,839,026 B2
(45) Date of Patent: Nov. 23, 2010

(54) POWER DISCHARGE CONTROL SYSTEM

(75) Inventors: Lan Huang, Shanghai (CN); Shih-Hao Liu, Taipei (TW)

(73) Assignee: Inventec Corporation, Taipei (TW)

( * ) Notice: Subject to any disclaimer, the term of this patent is extended or adjusted under 35 U.S.C. 154(b) by 311 days.

(21) Appl. No.: 12/220,778

(22) Filed: Jul. 28, 2008

(65) Prior Publication Data

US 2009/0284081 A1 Nov. 19, 2009

(30) Foreign Application Priority Data

May 14, 2008 (CN) .................. 2008 1 0107816

(51) Int. Cl.
*H01H 47/00* (2006.01)
(52) U.S. Cl. .................................... 307/99
(58) Field of Classification Search ............ 307/99
See application file for complete search history.

(56) References Cited

U.S. PATENT DOCUMENTS 6,278,598 B1 * 8/2001 Suzuki et al. ............ 361/93.9
6,608,746 B2 * 8/2003 Ku ............................ 361/234

* cited by examiner

*Primary Examiner*—Jared J Fureman
*Assistant Examiner*—Dru M Parries
(74) *Attorney, Agent, or Firm*—Peter F. Corless; Steven M. Jensen; Edwards Angell Palmer & Dodge LLP

(57) ABSTRACT

A power discharge control system for eliminating residual voltage of electronic components in an electronic device, is proposed, which includes a control IC for outputting first electrical signals of a first level and a second level respectively corresponding to power on and power off of the electronic device; a power supply for receiving the first electrical signal, and providing or terminating operation power to the electronic component accordingly, and delaying outputting of a second electrical signal equivalent to the first electrical signal level; a logic judgment module connected to the control IC and the power supply for receiving the first and the second electrical signals for executing logic operation process, when at least one of the first and the second electrical signals is at the first level, a third electrical signal of a third level is outputted, when both the first and the second electrical signals are at the second level, a third electrical signal of a fourth level is outputted; and at least a discharge module for receiving the third electrical signal, when the third electrical signal is at the third level, the discharge process is skipped, when the third electrical signal is at the fourth level, the discharge process is executed.

10 Claims, 4 Drawing Sheets

POWER DISCHARGE CONTROL SYSTEM

BACKGROUND OF THE INVENTION

1. Field of the Invention

This invention generally relates to a power control technique, and more specifically, to a power discharge control system applicable to an electronic device for eliminating residual voltage of each electronic component therein.

2. Description of Related Art

Discharge circuit is commonly disposed in modern electronic devices, e.g. personal computer, server, etc., thereby enabling the electronic device to discharge residual power from operation power provided for each electronic component therein when power supply of the electronic device is in a power off state.

Referring to FIG. 1, a circuit of an existing power discharge control system is illustrated. As shown in the figure, the power discharge control system 10 is used on an electronic device having a power supply 11, wherein the power supply 11 serves the purpose of providing each electronic component 13 inside the electronic device with various types of operation power, such as 5V and 3.3V. Furthermore, the power supply 11 has a power discharge control pin (N12V) 111 for outputting the respective low level electrical signal and high level electrical signal that correspond to power on and power off states of the electronic device.

As shown in the figure, the power discharge control system 10 includes a plurality of dissipative resistors 101 electrically connected to the power supply 11 (in the figure, the dissipative resistor 101 includes two fixed resistors connected in parallel, but not restricted to as shown herein), wherein a switch unit 105 and the plurality of dissipative resistors 101 are electrically connected to the power discharge control pin 111 (as shown in the figure, the switch unit 105 is an n-channel Junction Field Effect Transistor (JFET)), a gate of the switch unit 105 (JFET) is electrically connected to the power discharge control pin 111, a drain of the switch unit 105 is electrically connected to the dissipative resistors 101, and a source of the switch unit 105 is grounded. After the electronic device is turned off, the power discharge control pin 111 immediately outputs a high level electrical signal to the gate of the switch unit 105, thereby turning on the switch unit 105, and consequently providing the operation power of the power supply that is electrically connected to the dissipative resistors 101 with a power discharge path to ground, so as to achieve the objective of residual power discharge of the electronic devices.

As the technology advances, new models of power supply have also been developed. However, new power supply models are not equipped with said power discharge control pin 111. Hence if said power discharge control system 10 is adopted, it is obvious that the current system is not capable of eliminating residual voltage of electronic device when the power supply is turned off. As there is no other compatible power discharge control system, when the power supply is in a power off state, residual power of the electronic device can only be released by means of spontaneous power consumption, and spontaneous discharging speed depends on disposition of each electronic component that receives operation power from the power supply 11. Generally, spontaneous discharging speed is slower, and consequently, the residual voltage will remain inside the electronic device for a longer period during the power off stage. The residual voltage will further cause some electronic components inside the electronic device to operate erroneously, thereby resulting in an adverse effect on operations of the electronic device at the subsequent power on. Besides, the operation time of each electronic component is indirectly prolonged due to the aforementioned error, and as a result, the life span of each electronic component is further decreased.

Hence, it is a highly urgent issue in the semiconductor industry to design an effective device to provide a power discharge control system that is capable of solving the drawbacks of the aforementioned technique.

SUMMARY OF THE INVENTION

In view of the disadvantages of the prior art mentioned above, it is a primary objective of the present invention to provide a power discharge control system applicable to an electronic device, and the power discharge control system is capable of effectively and quickly discharging residual voltage of each electronic component inside the electronic device while the electronic device is in a power off state.

It is another objective of the present invention to provide a power discharge control system applicable to electronic device, and the system is capable of prolonging the life span of electronic components inside the electronic device.

It is a further objective of the present invention to provide a power discharge control system applicable to electronic device, and the system is capable of preventing the residual voltage from remaining inside the electronic device for too long, which may lead to erroneous operation of the electronic components inside the electronic device, thereby further preventing adverse effect on the operation of electronic device at the subsequent power on.

To achieve the aforementioned and other objectives, a power discharge control system is provided according to the present invention. The power discharge control system is applicable to an electronic device for discharging residual voltage of each electronic component therein. The power discharge control system contains: a control IC for generating first electrical signals of a first level and a second level respectively according to power on and power off states of the electronic device; a power supply electrically connected to the control IC and said electronic component for receiving the first electrical signal outputted from the control IC with the signal serving as a basis for providing or terminating at least one operation power to said electronic component, wherein the power supply delays outputting a second electrical signal equivalent to the first electrical signal; a logic judgment module coupled to the control IC and the power supply for receiving the first electrical signal outputted from the control IC as well as the second electrical signal outputted from the power supply, executing logic operation process, and allowing outputting of a third electrical signal of a third level when at least one of the first and second electrical signals is at the first level as well as outputting of a third electrical signal of a fourth level when the first and second electrical signals are at the second level; and at least a discharge module for receiving the third electrical signal outputted from the logic judgment module, wherein when the third electrical signal is at the third level, the discharge process is skipped, and when the third electrical signal is at the fourth level, the discharge process is executed.

In particular, the control IC is a Southbridge IC.

Furthermore, in one embodiment of the power discharge control system of the present invention, the first level corresponding to the power on command is a high level, while the second level corresponding to the power off command is a low level. The logic judgment module further includes: a first logic judgment unit having a first control terminal, a first end, and a second end, wherein the first control terminal is electrically connected to the control IC for receiving the first electrical signal, the first end is electrically connected to a backup power, and the second end is grounded; and a second logic judgment unit having a second control terminal, a third end, and a fourth end, wherein the second control terminal is electrically connected to the power supply for receiving the second electrical signal, the third end is electrically connected to the backup power, and the fourth end is grounded. Preferably, the first logic judgment unit and the second logic judgment unit are made up of NMOS transistors, for example. The first control terminal and the second control terminal are gates of said NMOS transistors. The first end and the third end are drains of said NMOS transistors. Finally the second end and the fourth end are sources of said NMOS transistors.

Specifically, the discharge module includes: a dissipative resistor with one end of the dissipative resistor electrically connected to a branch node formed between the power supply and the electronic component, serving to receive operation power; and a switch unit having a third control terminal, a fifth end, and a sixth end, with the third control terminal electrically connected to the logic judgment module for receiving the third electrical signal outputted therefrom, the fifth end coupled to another end of the dissipative resistor, and the sixth end grounded. When the third electrical signal received by the third control terminal is at the third level, electrical connection between the fifth end and the sixth end of the switch unit is cut off, otherwise when the third electrical signal is at the fourth level, the switch unit is turned on to connect the fifth end and the sixth end, thereby executing a discharge process on residual voltage of the electronic component. In one embodiment of the present invention, the third level is a low level, while the fourth level is a high level.

In addition, in one embodiment, the switch unit is an NMOS transistor. The gate of the NMOS transistor is used as the third control terminal, which is electrically connected to the logic judgment module. The drain of the NMOS transistor is used as the fifth end electrically connected to the dissipative resistor. Finally, the source of the NMOS transistor is used as the sixth end for grounding. In another embodiment, the switch unit is an NPN transistor. A base of the NPN transistor is used as the third control terminal, which is electrically connected to the logic judgment module. A collector of the NPN transistor is used as the fifth end electrically connected to the dissipative resistor. An emitter of the NPN transistor is used as the sixth end for grounding.

Compared to the prior art, the power discharge control system of the present invention is characterized by adopting the logic judgment module, which is electrically connected to the control IC and the power supply, for receiving the respective first and second electrical signals therefrom and performing logic operations Accordingly, when at least one of the first and the second electrical signals is at the first level, the third electrical signal of the third level is generated, and when both the first and the second electrical signals are at the second level, the third electrical signal of the fourth level is outputted. The discharge module receives the third electrical signal outputted from the logic judgment module. When the third electrical signal is at the third level, a discharge process on the electronic device is skipped, and when the third electrical signal is at the fourth level, the discharge process on residual voltage of the electronic component is executed. Correspondingly, as the discharge process on the electronic component is efficiently accomplished when the electronic device is in a power off state, therefore the operating time of the electronic component inside the electronic device is reduced. In other words, the life span of the electronic component of the electronic device is prolonged. Moreover, the residual voltage is prevented from remaining inside the electronic device for too long which may lead to erroneous operation of some electronic components inside the electronic device and cause unfavorable situation at the moment the electronic device is turned on again.

BRIEF DESCRIPTION OF DRAWINGS

The present invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention; those in the art can apparently understand these and other advantages and effects after reading the disclosure of this specification. The present invention can also be performed or applied by other different embodiments. The details of the specification may be on the basis of different points and applications, and numerous modifications and variations can be devised without departing from the spirit of the present invention.

Figure 1:
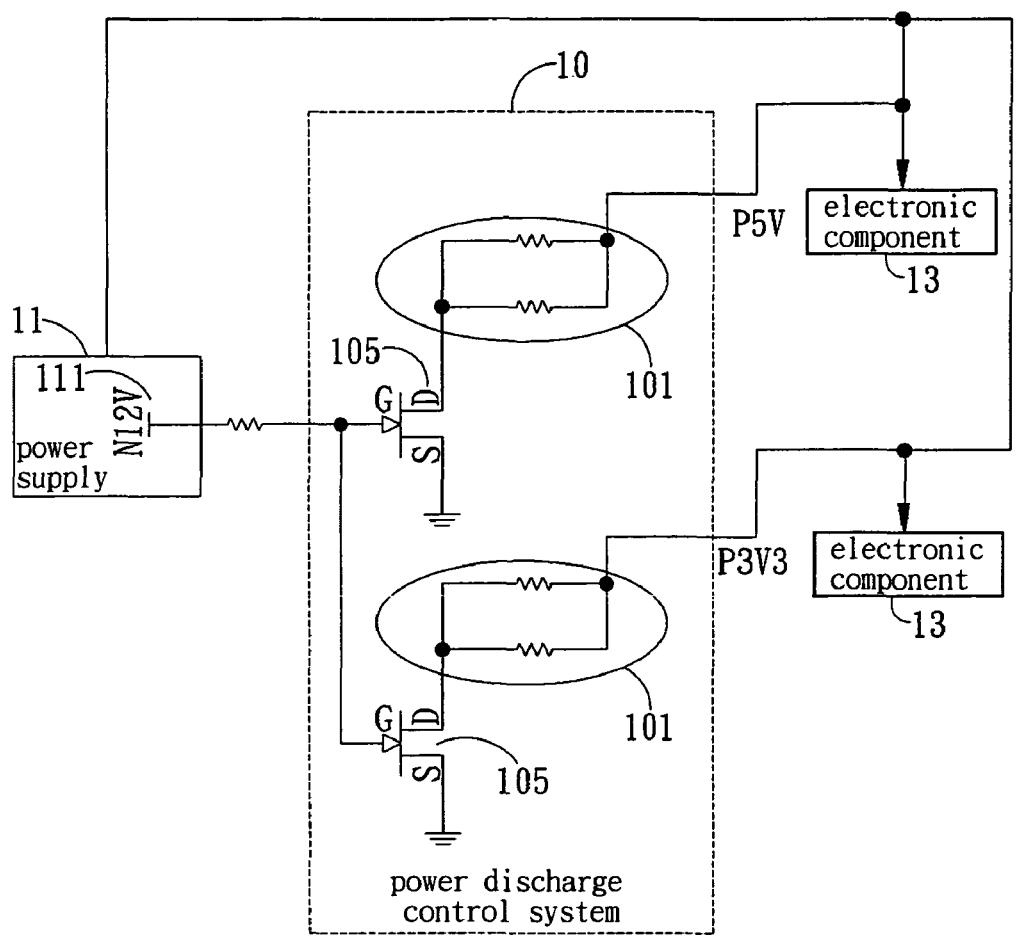
FIG. 1 is a diagram illustrating a circuit of an existing power discharge control system.
Figure 2:
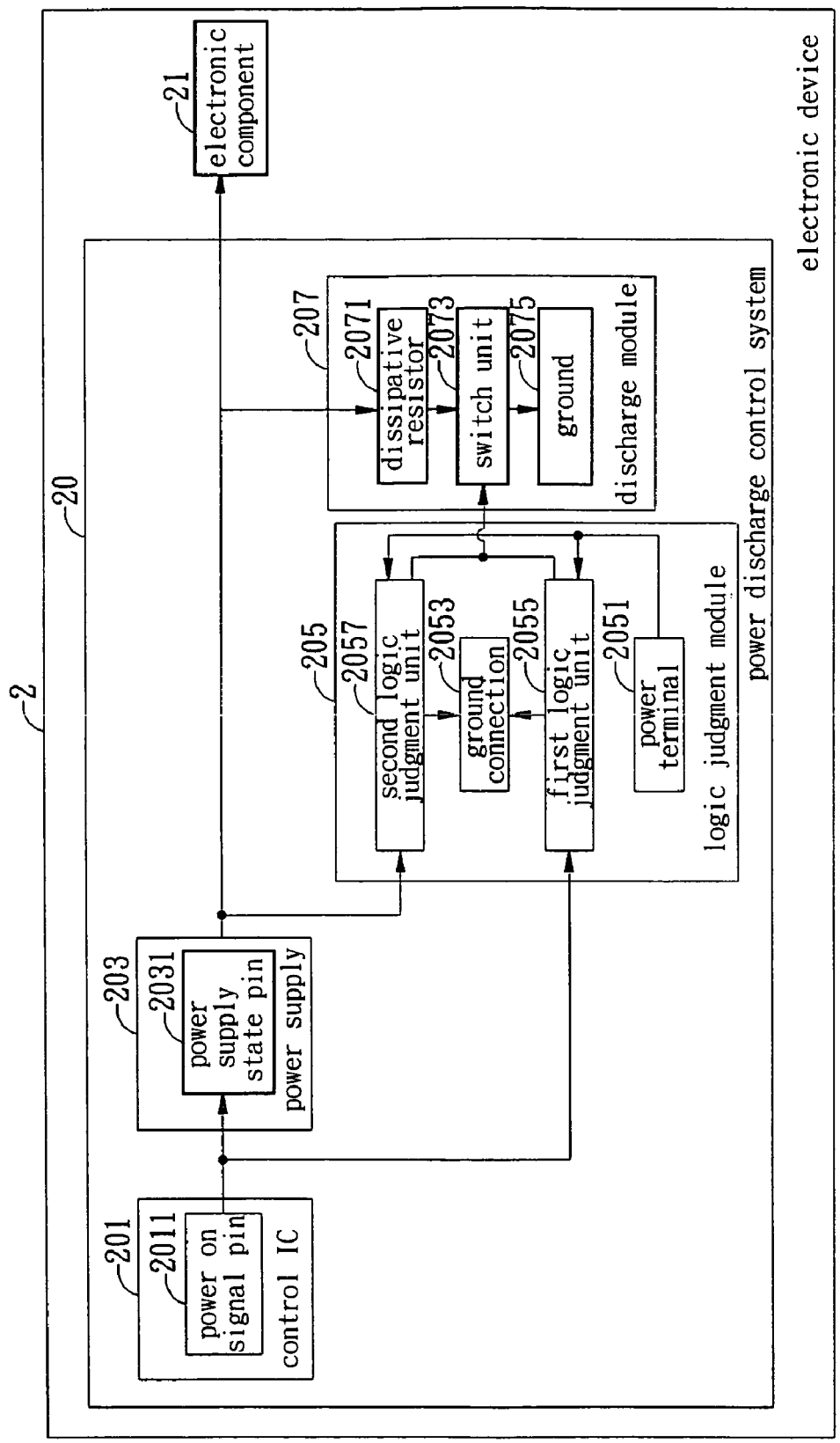
FIG. 2 is a block diagram illustrating a first embodiment of the power discharge control system of the present invention applied to an electronic device.

Referring to FIG. 2, a block diagram of a power discharge control system applied to an electronic device according to one embodiment of the present invention is shown. As shown in the diagram, the power discharge control system 20 of the present invention is applicable to electronic devices 2, such as personal computer, server, or others, and serves the purpose of eliminating residual voltage of each electronic component 21 inside the electronic device 2 while the electronic device is turned off.

As shown in the FIG. 2, the power discharge control system 20 of the present invention includes control IC 201, power supply 203, logic judgment module 205, and discharge module 207. Detailed descriptions of each of said components of the power discharge control system 20 of the present invention will be outlined below with reference to FIGS. 3 and 4.

The control IC 201 serves to output first electrical signals of a first level and a second level respectively according to the power on and power off commands of the electronic device 2. In the present embodiment, the control IC 201 has a power on signal pin (CNTR_PS_ON) 2011, and the first electrical signal is outputted via the power on signal pin 2011. The first level and the second level corresponding to power on and power off commands of the electronic device 2 respectively are high level and low level respectively. Preferably, the control IC 201 is a Southbridge IC.

The power supply 203 is electrically connected to the respective control IC 201 and electronic component 21 and serves to execute power management process on the electronic component 21 according to the first electrical signal outputted via the power on signal pin 2011. More specifically, the power supply 203, when the electronic device 2 is turned on, receives the external AC power in response to the first level of the first electrical signal and then converts the external AC power into operation power applicable to the electronic component 21 inside the electronic device 2. The power supply 203 subsequently outputs the operation power. Since each electronic component 21 disposed inside the electronic device 2 has a particular function, operation power varies with different electronic components 21. For instance, various voltage levels of operation power suitable for operation of the electronic device 2 are 3.3V, 5V, 12V, and etc. In the following embodiment, the electronic device 2 is supplied with 3.3V and 5V but is not restricted as stated herein. In other embodiments, the electronic device 2 can be supplied with 3.3V only, 5V only, 12V only, or a combination of at least two types of the above-mentioned power supplies. In other words, number of operation power type provided by the power supply 203 depends on the demands of different electronic components 21 in the electronic device 2. When the electronic device 2 is turned off, according to the second level of the first electrical signal, the power supply 203 stops providing operation power to the electronic component 21.

Figure 3:
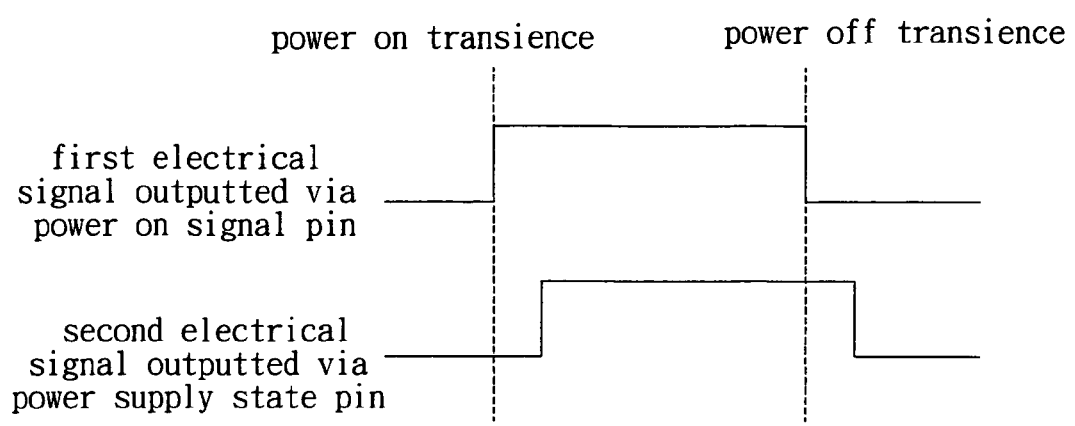
FIG. 3 is a diagram illustrating a timing sequence of a first electrical signal outputted from a power on signal pin and a second electrical signal outputted from a power supply state pin corresponding to power on and power off stats respectively of the electronic device.

Preferably, the power supply 203 has a power supply state pin (PGD_PS_P5V_STBY) 2031 electrically connected to the power on signal pin 2011. The power supply state pin 2031 receives the first electrical signal outputted via the power on signal pin 2011 as well as delays outputting the second electrical signal equivalent to the first electro signal level. Referring to FIG. 3, a diagram illustrating a timing sequence of the first electrical signal and the second electrical signal corresponding to the power on and power off commands respectively of the electronic device is shown. As shown in the figure, the second electrical signal is processed and outputted by the power supply 203 after receiving the first electrical signal outputted via the power on signal pin 2011. Therefore, in the timing sequence, the second electrical signal is outputted after the first electrical signal, as reflected on the timing sequence diagram. When the electronic device 2 is turned on, the first electrical signal becomes a high level (namely the first level) electrical signal before the second electrical signal does, and when the electronic device is turned off, the first electrical signal drops to a low level (namely the second level) electrical signal before the second electrical signal does.

The logic judgment module 205 is electrically connected to the power on signal pin 2011 of the control IC 201 and the power supply state pin 2031 of the power supply 203 and receives the first electrical signal outputted via the power on signal pin 2011 and the second electrical signal outputted via the power supply state pin 2031. Subsequently logic operation process on the first and second electrical signals is executed. Accordingly, if at least one of the first electrical signal and the second electrical signal is at the first level, then the third electrical signal of the third level is outputted, otherwise, if both the first and the second electrical signals are at the second level, then the third electrical signal of the fourth level is outputted.

In one embodiment, the logic judgment module 205 includes a power terminal 2051, a first logic judgment unit 2055, and a second logic judgment unit 2057, wherein the power terminal 2051 provides a backup power immediately after the electronic device 2 is connected an external AC power. More specifically, the backup power is a voltage obtained by connecting the power supply 203 to the external power. In a power off state, the backup power will exist as long as the external power is not cut off. Also the level of the backup power at least equals to the enable level of the switch unit 2073. Details of the switch unit 2073 will be described later. The first logic judgment unit 2055 includes a first control terminal 20551, a first end 20553, and a second end 20555, wherein the first control terminal 20551 is electrically connected to the power on signal pin 2011 of the control IC 201 for receiving the first electrical signal, the first end 20553 is electrically connected to the power terminal 2051 for receiving the backup power, and the second end 20555 is grounded directly. The second logic judgment unit 2057 includes a second control terminal 20571, a third end 20573, and a fourth end 20575, wherein the second control terminal 20571 is electrically connected to the power supply state pin 2031 of the power supply 203 for receiving the second electrical signal, the third end 20573 is electrically connected to the power terminal 2051 for receiving the backup power, and the fourth end 20575 is directly grounded.

According to the present embodiment, the first logic judgment unit 2055 and the second logic judgment unit 2057 are NMOS transistors, but not restricted to as illustrated herein. In other embodiments, the first logic judgment unit 2055 and the second logic judgment unit 2057 can be NPN transistors, n-channel Junction Field Effect Transistors (JFET), other equivalent electronic components or electronic circuits. A gate of the first logic judgment unit 2055 is used as the first control terminal 20551 electrically connected to the power on signal pin 2011, and a gate of the second logic judgment unit 2057 is used as the second control terminal 20571 electrically connected to the power supply state pin 2031. A drain (namely the first end 20553) of the first logic judgment unit 2055 and a drain (namely the third end 20573) of the second logic judgment unit 2057 are electrically connected to each other. Two paths are formed at the electrical connection between the drain of the first logic judgment unit 2055 and the drain of the second logic judgment unit 2057, one path is electrically connected to a third control terminal 20731 of the switch unit 2073, while the other path is electrically connected to the power terminal 2051. Sources of the first and the second logic judgment units 2055 and 2057 are respectively used as the second end 20555 and the fourth end 20575 and are directly grounded. Specifically, the first logic judgment unit 2055 receives, via the first control terminal 20551, the first electrical signal outputted from the power on signal pin 2011; the second logic judgment unit 2057 receives, via the second control terminal 20571, the second electrical signal outputted from the power supply state pin 2031. When either one of the first electrical signal or the second electrical signal is a high level electrical signal, then either one of the first logic judgment unit 2055 or the second logic judgment unit 2057 is made to conduct signals, thereby pulling down the electrical signal level of the drain of the first logic judgment unit 2055 (or the second logic judgment unit 2057), and further producing a third electrical signal of a low level, namely a third level which is then outputted to the third control terminal 20731 of the switch unit 2073. As a result, the switch unit 2073 is turned off. Otherwise, if both the first electrical signal and the second electrical signal are low level electrical signals, the first logic judgment unit 2055 and the second logic judgment unit 2057 are turned off, thereby electrically connecting the drains of the first and the second logic judgment units 2055 and 2057 to the power terminal (P5V_STBY) 2051, so as to obtain and output the third electrical signal of the same level as the enable level of the switch unit 2073 (namely the fourth level, details will be given later) to the third control terminal 20731 of the switch unit 2073, which will be correspondingly turned on. It should be stated herein that the logic judgment module 205 is not restricted to as stated above. In other embodiments, the logic judgment module 205 can be other electronic component or electronic circuit with logic operation function.

The discharge module 207 includes a dissipative resistor 2071 electrically connected to the power supply 203 for receiving operation power therefrom and the switch unit 2073.

Figure 4:
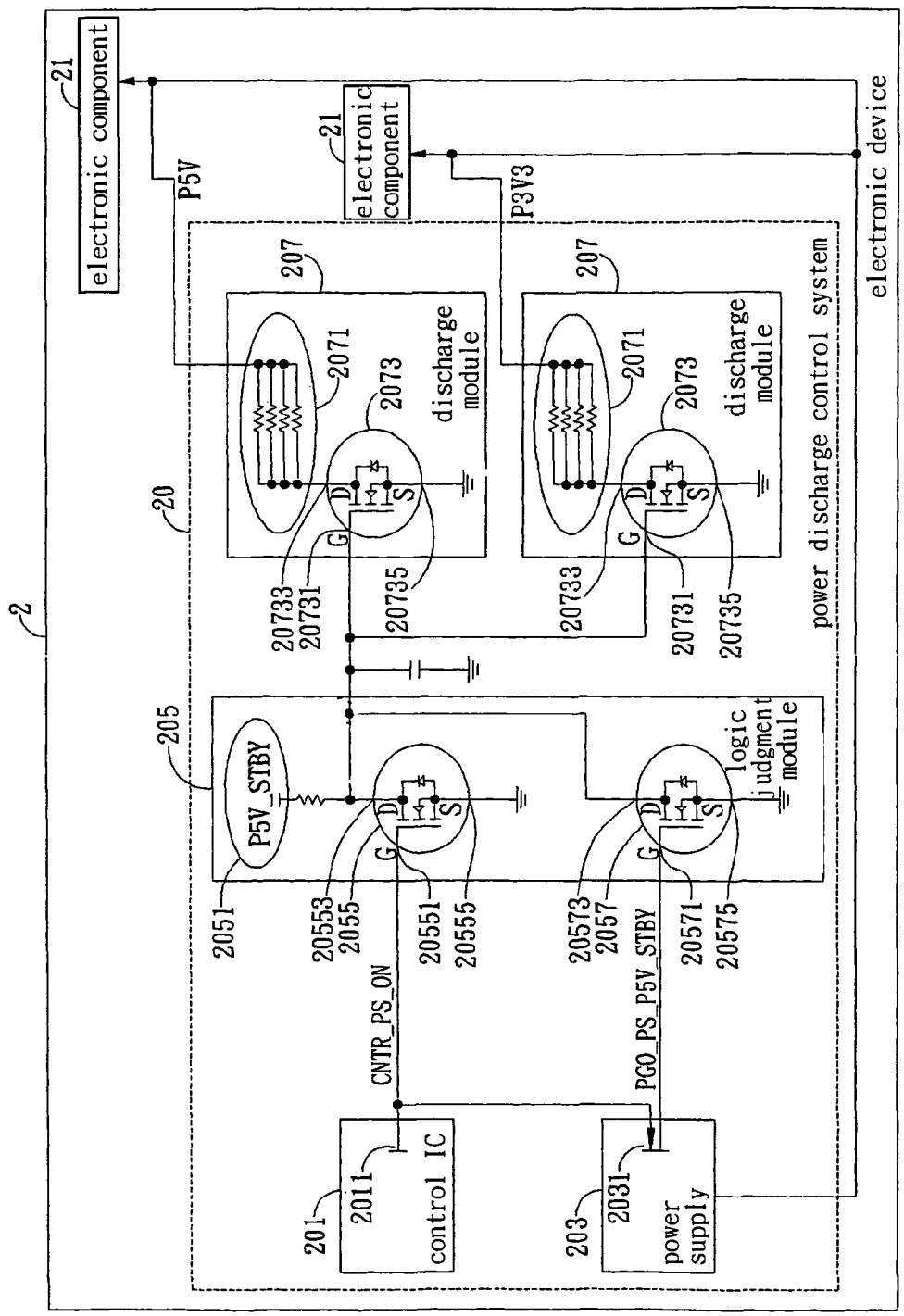
FIG. 4 is a diagram illustrating a circuit of the power discharge control system of one embodiment of the present invention applied to an electronic device.

One end of the dissipative resistor 2071 is electrically connected to a branch node formed at electrical connection between the power supply 203 and the electronic component 21 for receiving operation power, and another end of the dissipative resistor 2071 is electrically connected to the switch unit 2073 and grounded via the switch unit 2073. Specifically, when the power supply 203 is providing operation power to the electronic component 21, the dissipative resistor 2071 receives operation power provided by the power supply 203 However since the switch unit 2073 that is electrically connected to another end of the dissipative resistor 2071 is not turned on (details will be given later), therefore no discharge process is performed. Conversely, when the power supply 203 stops providing operation power to the electronic component 21, the switch unit 2073 that is electrically connected to anther end of the dissipative resistor 2071 is turned on. At this moment, residual operation power, namely the residual voltage, of the electronic component 21 is directly grounded via the dissipative resistor 2071, thereby achieving the objective of discharging power. Resistance of the dissipative resistor 2071 decides the discharging speed of the electronic component 21 when the electronic device 2 is turned off. In other words, the smaller the resistance, the faster the discharging speed, and therefore less discharging time is required. As shown in FIG. 4, the dissipative resistor 2071 is formed by connecting four fixed resistors in parallel according to the present embodiment, but not restricted to as illustrated herein. Any arrangement of dissipative resistors capable of accomplishing the target resistance falls in the application scope of the present invention.

The switch unit 2037 includes the third control terminal 20731 electrically connected to the logic judgment module 205, a fifth end 20733, and a sixth end 20735. The switch unit 2073 has an enable level, which is compared to the third electrical signal received via the third control terminal 20731 from the logic judgment module 205. The switch unit 2073 is turned on when the third electrical signal is equal to the enable level, that is, the third electrical signal is at the fourth level, thereby forming a power discharging path between the electronic component 21 and the ground for executing a discharge process on residual voltage of the electronic component 21. In particular, the enable level is a threshold value of the high-level electrical signal. In the present embodiment, the switch unit 2073 is an NMOS transistor, wherein a gate of the NMOS transistor is used as the third control terminal 20731, a drain of the NMOS transistor is used as the fifth end 20733 for electrically connecting to another end of the dissipative resistor 2071, and a source of the NMOS transistor is used as the sixth end 20735 which is directly grounded, but not restricted to as stated herein. In another embodiment, the switch unit 2073 can be an NPN transistor, wherein a base of the NPN transistor is used as the third control terminal 20731, a collector of the NPN transistor is used as the fifth end 20733 for electrically connecting to another end of the dissipative resistor 2071, and emitter of the NPN resistor is used as the sixth end 20735 for direct grounding. However, the type of the switch unit 2073 is not restricted to as stated in said embodiments. Any electronic components such as n-channel Junction Field Effect Transistor (JFET), or electronic circuit, having switching characteristics as well as controllable by the third electrical signal outputted by the logic judgment module 205, fall in the application scope of the present invention.

In order to more clearly comprehend the discharge process on the residual voltage of the electronic components 21 when applying the power discharge control system 20 of the present invention, the description as follows will be based on the operation power of 3.3 V and 5V allocated to the electronic device 2, as well as the first logic judgment unit 2055, the second logic judgment unit 2057, and the switch unit 2073 made up of NMOS transistors with reference to FIGS. 3 and 4. As shown in FIGS. 3 and 4, after the electronic device 2 is turned off, at the moment of turning off, only the power on signal pin 2011 outputs the first electrical signal of a low level, namely the second level, while the power supply state pin 2031 is still outputting the second electrical signal of a high level. A moment later, the second electrical signal becomes a low level electrical signal. According to the above-mentioned operation principle of the logic judgment module 205, only when both the first and the second electrical signals are at a low level, the logic judgment module 205 outputs the third electrical signal equivalent to enable level of the switch unit 2073, namely the high-level fourth level, to the third control terminal 20731 of the switch unit 2073, thereby turning on the switch unit 2073 and further connecting the fifth end 20733 and the sixth end 20735. Consequently a power discharge path is formed between the electronic component 21 and the ground for further execution of the discharge process on residual voltage of the electronic component 21. On the other hand, with reference to FIG. 3, after the electronic device 2 is turned on, either at the moment of turning on the electronic device 2 when only the power on signal pin 2011 is outputting the first electrical signal of a high level (the first level), or a time period after the electronic device 2 has been turned on for a while when both the first electrical signal outputted via the power on signal pin 2011 and the second electrical signal outputted via the power supply state pin 2031 are high level electrical signals, according to abovementioned operation principle of the logic judgment module 205, the logic judgment module 205 will output the third electrical signal of a low level, namely the third level, to the third control terminal 20731 of the switch unit 2073 as long as one of the first and the second electrical signals is a high level electrical signal. Consequently the switch unit 2073 is turned off and the power discharge path of the electronic component 21 is cut off, thereby providing power to the electronic component 21 normally while the electronic device 2 is in a power on state.

In summary, the power discharge control system of the present invention is characterized by adopting a logic judgment module, which is electrically connected to a power supply state pin of the power supply as well as a power on signal pin of the control IC, e.g. a Southbridge IC, for receiving the first signal and the second signal therefrom, and logical operation process on the first and second electrical signals is then executed. Accordingly, when at least one of the first and second electrical signals is at the first level, then the third electrical signal of the third level is generated, otherwise, when both the first and second electrical signals are at the second level, the third electrical signal of the fourth level is outputted. Subsequently, the discharge module receives the third electrical signal outputted from the logic judgment module. When the third electrical signal is at the third level, the discharge process is skipped, otherwise when the third electrical signal is at the fourth level, the discharge process on residual voltage of the electronic component is executed. Accordingly, when the electronic device is turned off, the discharge process on residual voltage of the electronic component inside the electronic device is efficiently and quickly completed, thereby reducing operation time of the electronic component inside the electronic device and preventing the residual voltage of the electronic device from causing some electronic components inside the electronic device to operate erroneously, and further avoiding unfavorable operation situation against the electronic device while being turned on again, Also drawbacks of the prior art will be avoided. In the prior art, the only means to discharge power from electronic components is by spontaneous power consumption, thereby leading to a shorter life span of electronic components.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A power discharge control system for eliminating residual voltage of at least an electronic component in an electronic device, comprising:
   a control IC for outputting first electrical signals of a first level and a second level respectively corresponding to power on and power off commands of the electronic device;
   a power supply electronically connected to the control IC and the at least an electronic component, wherein the power supply receives the first electrical signal outputted by the control IC, so as to accordingly provide or terminate at least an operation power to the at least an electronic component, and delays outputting a second electrical signal which is equivalent to the first electrical signal level;
   a logic judgment module coupled to the control IC and the power supply, wherein the logic judgment module receives the first electrical signal outputted by the control IC as well as the second electrical signal outputted by the power supply, executes logic operation process, and outputs a third electrical signal of a third level when at least one of the first electrical signal and the second electrical signal is at the first level and outputs a third electrical signal of a fourth level when both the first electrical signal and the second electrical signal are at the second level; and
   at least a discharge module, for receiving the third electrical signal outputted from the logic judgment module, and to determine a discharge process to be skipped when the third electrical signal is at the third level and the discharge process to be executed when the third electrical signal is at the fourth level.

2. The power discharge control system of claim 1, wherein the control IC is a Southbridge IC.

3. The power discharge control system of claim 1, wherein the first level corresponding to the power on command is a high level, and the second level corresponding to the power off command is a low level.

4. The power discharge control system of claim 1, wherein the logic judgment module further comprises:

a first logic judgment unit having a first control terminal, a first end, and a second end, wherein the first control terminal is electrically connected to the control IC for receiving the first electrical signal, the first end is electrically connected to a backup power, and the second end is grounded; and
a second logic judgment unit having a second control terminal, a third end, and a fourth end, wherein the second control terminal is electrically connected to the power supply for receiving the second electrical signal, the third end is electrically connected to the backup power, and the fourth end is grounded.

5. The power discharge control system of claim 4, wherein the first logic judgment unit and the second logic judgment unit are NMOS transistors, the first control terminal and the second control terminal are gates of the NMOS transistors, the first end and the third end are drains of the NMOS transistors, and the second end and the fourth end are sources of the NMOS transistors.

6. The power discharge control system of claim 1, wherein the discharge module comprises:
   a dissipative resistor, wherein one end of the dissipative resistor is electrically connected to a branch node formed at electrical connection of the power supply and the electronic component for receiving the operation power; and
   a switch unit having a third control terminal, a fifth end, and a sixth end, wherein the third control terminal is electrically connected to the logic judgment module for receiving the third electrical signal outputted therefrom, the fifth end is coupled to another end of the dissipative resistor, the sixth end is grounded, and an electrical connection between the fifth end and the sixth end of the switch unit is cut off when the third electrical signal received by the third control terminal is at the third level and the switch unit is turned on to electrically connect the fifth end and the sixth end for executing the discharge process on residual voltage of the electronic component when the third electrical signal is at the fourth level .

7. The power discharge control system of claim 1, wherein the third level is a low level, and the fourth level is a high level.

8. The power discharge control system of claim 6, wherein the switch unit is an NMOS transistor, a gate of the NMOS transistor is used as the third control terminal for electrically connecting the logic judgment module, a drain of the NMOS transistor is used as the fifth end for electrically connecting the dissipative resistor, and a source of the NMOS transistor is used as the sixth end which is grounded.

9. The power discharge control system of claim 6, wherein the switch unit is an NPN transistor, a base of the NPN transistor is used as the third control terminal for electrically connecting the logic judgment module, a collector of the NPN transistor is used as the fifth end for electrically connecting the dissipative resistor, and an emitter of the NPN transistor is used as the sixth end which is grounded.

10. The power discharge control system of claim 6, wherein the third level is a low level, and the fourth level is a high level.

* * * * *